United States Patent
Tseng et al.

(10) Patent No.: US 7,259,029 B2
(45) Date of Patent: Aug. 21, 2007

(54) METHOD OF FORMING PROTECTIVE STRUCTURE FOR ACTIVE MATRIX TRIODE FIELD EMISSION DEVICE

(75) Inventors: Huai-Yuan Tseng, Pingzhen (TW); Chun-Tao Lee, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 264 days.

(21) Appl. No.: 11/138,285

(22) Filed: May 27, 2005

(65) Prior Publication Data

US 2006/0234406 A1    Oct. 19, 2006

(30) Foreign Application Priority Data

Apr. 13, 2005   (TW) .............................. 94111601 A

(51) Int. Cl.
*H01L 21/8234* (2006.01)
(52) U.S. Cl. .................. 438/20; 438/237; 257/29.115; 257/29.204
(58) Field of Classification Search .................. 438/20, 438/237
See application file for complete search history.

(56) References Cited

U.S. PATENT DOCUMENTS

| | | | |
|---|---|---|---|
| 5,844,370 A | 12/1998 | Cathey et al. | ........... 315/169.1 |
| 7,015,496 B2* | 3/2006 | Ohnuma et al. | .............. 257/10 |
| 2003/0122197 A1* | 7/2003 | Hwang et al. | .............. 257/360 |
| 2005/0156242 A1* | 7/2005 | Yamaguchi et al. | ........ 257/347 |
| 2005/0161742 A1* | 7/2005 | Isobe et al. | .................. 257/347 |

\* cited by examiner

*Primary Examiner*—Thanh Nguyen
(74) *Attorney, Agent, or Firm*—Troxell Law Office PLLC

(57) ABSTRACT

A method for forming a protective structure of active matrix triode field emission device is provided. The method comprises the steps of forming a silicon active region; depositing a gate oxide layer over the silicon active region; depositing and patterning a first metal layer over the gate oxide layer; doping impurities into portions of the said silicon active region to form a source/drain in a first conductive type and simultaneously to form a diode having a terminal in the first conductive type; forming ILD layer over the first metal layer and forming a plurality of contact holes thereon; depositing and patterning a second metal layer; forming a passivation layer over the second metal layer and forming a plurality of via holes thereon, depositing and patterning a third metal layer to form a gate and a tip structure.

5 Claims, 5 Drawing Sheets

METHOD OF FORMING PROTECTIVE STRUCTURE FOR ACTIVE MATRIX TRIODE FIELD EMISSION DEVICE

FIELD OF THE INVENTION

The present invention relates to a method of forming a protective structure for an active matrix triode field emission device, in particular to a method of forming a PI or IN diode as the protective structure while forming the source/drain area of the active matrix thin film transistor (TFT).

BACKGROUND OF THE INVENTION

The newest flat-panel display is the field emission display (FED), which is developed at about 1980. The basic principles of light emission are the same for the FED and the cathode ray tube (CRT). Electrons are emitted from the cathode, and collide with phosphors coated onto the anode to generate light. What is different is the cathode itself. The CRT uses a point electron source, while the FED has an array of fine electron sources. In the CRT the electrons emitted from the source are deflected and scanned across the screen to produce the image, while in the FED several hundred cathodes are used for lighting each pixel. There is no scanning. Electrons from the cathodes sited directly below the phosphors of a pixel create the image, and as a result the panel thickness can be reduced to several millimeters. Further, while the CRT is a hot cathode device, i.e. it heats the cathode to produce electrons, the FED uses a cold cathode that generates electrons with a high voltage instead.

Although the FEDs are welcomed and are ramping up for volume production in the recent years, it is problematic the gates of the field emission devices will easily rub into the air during the transportation so as to induce electrostatic charges. When the charges are accumulated to a certain amount, the huge voltage differences between the gate and the tip structure of the field emission device, ranged from hundreds to thousands Volt, will be generated, causing the tip of the device to emit electrons. However, the tip cannot endure too much electric current in a short time and will burn itself up, resulting in dead pixels in the display. Therefore, how to design a protective structure of FED in order to prevent the tip of the field emission devices from damaging of large electrostatic discharging is becoming the most urgent problem to be overcome in the industry.

Please refer to FIG. 1, which is the schematic view showing the cross-section of the field emission device structure according to the prior art for solving the electrostatic discharge problem. In FIG. 1, a PN diode 13 is formed between the gate 11 and the tip 12 of the field emission device 1 to generate a path for electrostatic discharging. However, such structure can only be applied in passive triode field emission device, and can not be applied to other kinds of field emission device. Besides, in order to form the PN diode, a extra anneal process as well as a doping process of two extra mask steps are required, which generates more problems such as increasing mask cost, extra thermal budge, and decreasing throughput, and so on.

SUMMARY OF THE INVENTION

It is the primary object of the present invention to provide a method of forming a protective structure for an active matrix triode field emission device, which is capable of forming a PI or IN diode as the protective structure while doping the source/drain area of the active matrix thin film transistor (TFT), employed as the component of cathode plate, are thus manufacturing a field emission device with sufficient ESD protection by a simple process.

In order to achieve the aforesaid object, the present invention provides a method of forming a protective structure for an active matrix triode filed emission device, comprising the steps of:

forming a silicon active region.

depositing a gate oxide layer over the silicon active region.

depositing and patterning a first metal layer over the gate oxide layer.

doping impurities into portions of the silicon active region to form a source/drain in a first conductive type and simultaneously to form a diode having a terminal in the first conductive type.

forming an inter layer dielectric (ILD) layer over the first metal layer and forming a plurality of contact holes thereon.

depositing and patterning a second metal layer.

forming a passivation layer over the second metal layer and forming a plurality of via holes thereon.

depositing and patterning a third metal layer to form a gate and a tip structure; wherein the gate connects to one terminal of the diode and the tip structure connects to the source/drain through said contact holes and said via holes.

Wherein, the aforesaid diode is a PI diode consisting of an intrinsic terminal connecting to the gate and a P-type terminal being said source/drain. Moreover, the diode can be an IN diode consisting of a N-type terminal connecting to said gate and an intrinsic terminal. Besides, the diode can also be an N$^-$N$^+$ diode consisting of a N$^+$ terminal connecting to said gate and a N$^-$ terminal.

Other aspects and advantages of the present invention will become apparent from the following detailed description, taken in conjunction with the accompanying drawings, illustrating by way of example the principles of the present invention.

DETAILED DESCRIPTION OF THE INVENTION

Matched with corresponding drawings, the preferable embodiments of the invention are presented as following and hope they will benefit your esteemed reviewing committee members in reviewing this patent application favorably.

Figure 1:
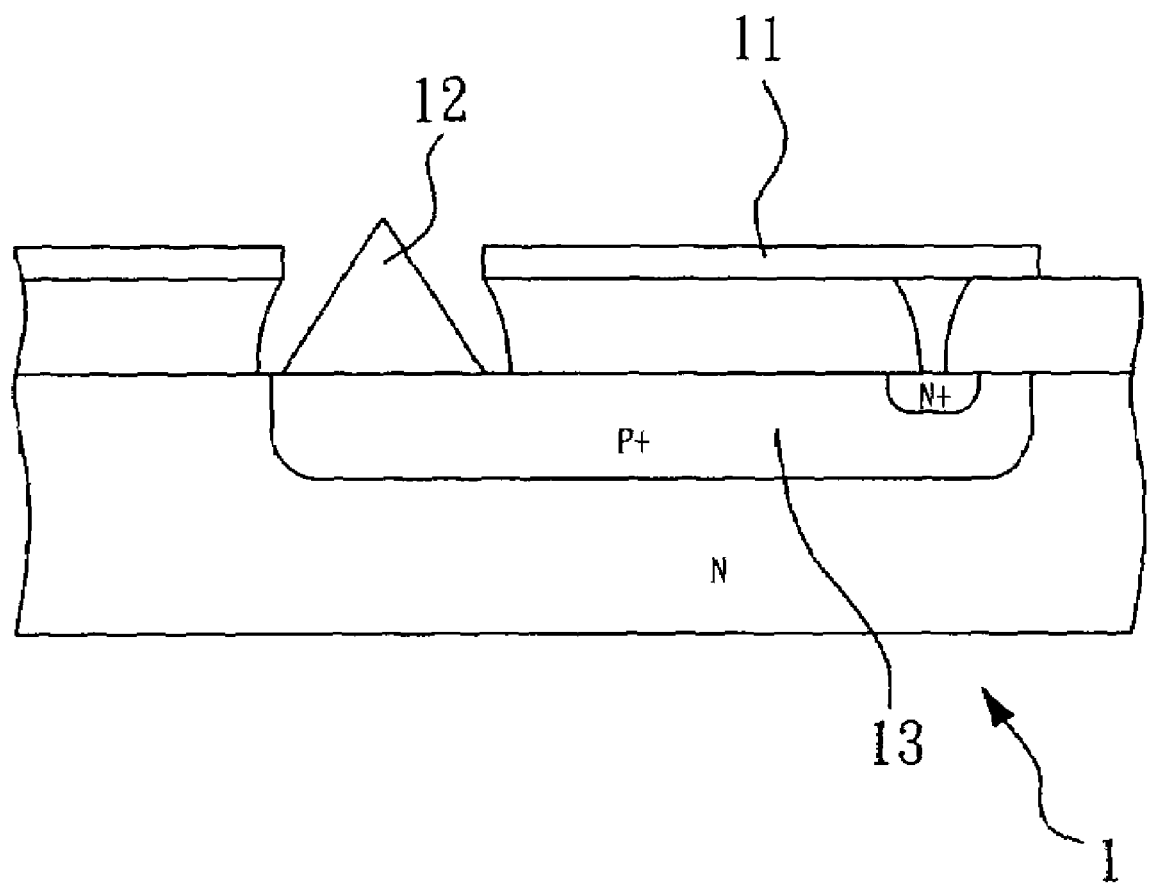
FIG. 1 is the schematic view showing the cross-section of the field emission device structure for solving the electrostatic discharge problem on the tip of the field emission device according to the prior art.
Figure 2:
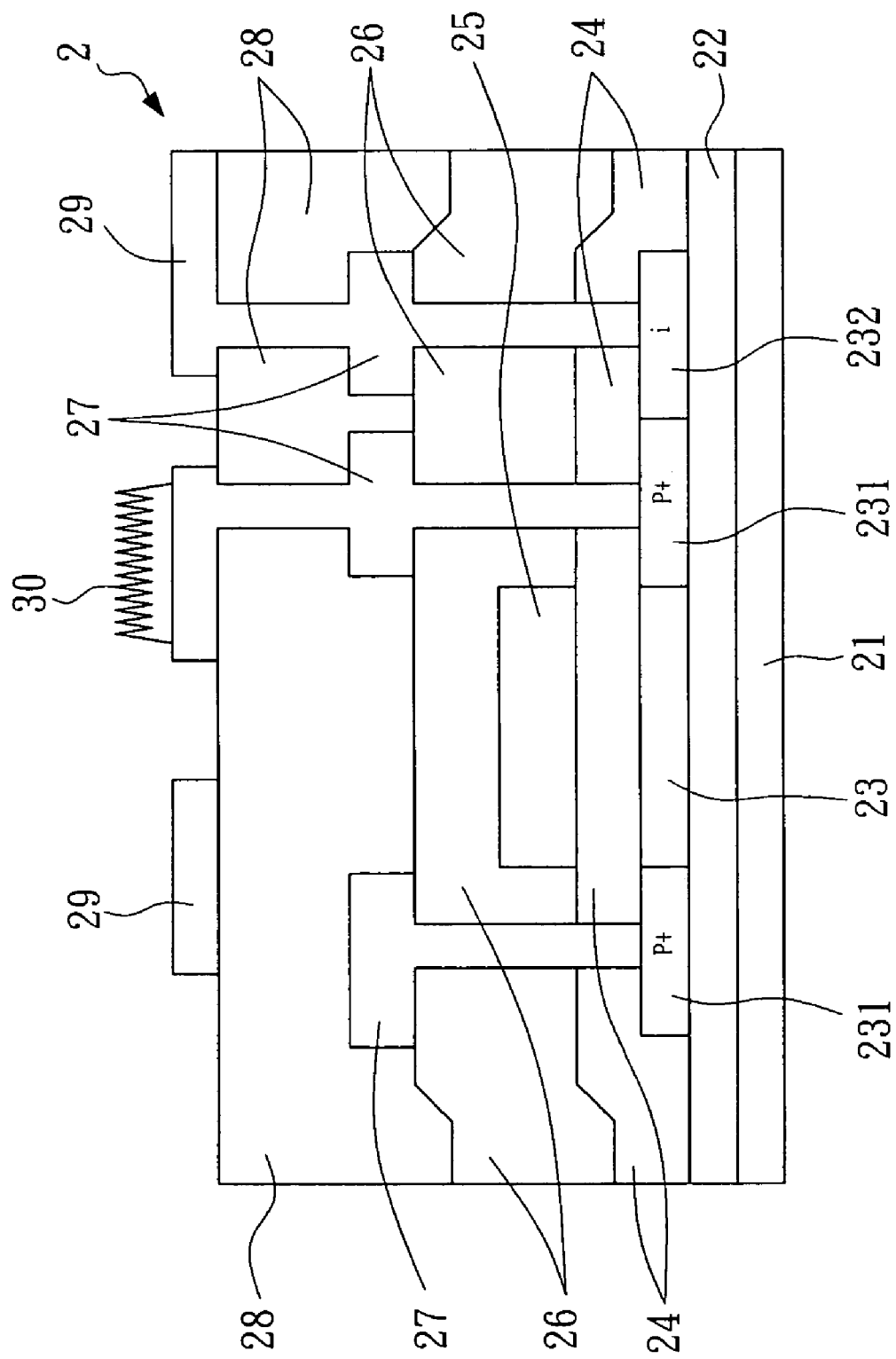
FIG. 2 is the schematic view showing the first embodiment of the active matrix triode field emission device according to the present invention.

Please refer to FIG. 2, which is the schematic view showing the first embodiment of the active matrix triode field emission device according to the present invention. The field emission device 2 comprises a glass substrate 21, an oxide layer 22, a silicon active layer 23, a gate oxide layer 24, a first metal layer 25, an inter layer dielectric (ILD) layer 26, a second metal layer 27, a passivation layer 28, a gate 29, and a tip structure 30. The aforesaid structure is almost the same as the traditional active triode field emission device, but the silicon active layer 23 includes a PI diode consisting of a P-type doped region 231 and an intrinsic region 232. The break down voltage of the aforesaid PI diode is larger than that of the general PN diode because the PI diode includes an un-doped intrinsic region 232, which presents a stable electricity state and has no surplus electrons or holes for conducting electricity. Therefore, in the normal operating state, the voltage difference between the gate 29 which connects to the intrinsic region 232 and the tip structure 30 which connects to the P-type doped region 231 is usually smaller than the break down voltage of the PI diode so that the discharging path from the gate 29 to the tip structure 30 will not be easily turned on, and thus being not able to affecting the normal function of the field emission device 2. Moreover, the process for forming the protective structure, the diode, only uses one P-type doping step so that the manufacturing process is more simplification and the cost is much lower.

The active device (driving circuit) of the field emission device 2 is similar to or the same as that of the normal Thin Film Transistor (TFT), which has been disclosed in the prior arts, and thus will not be redundantly described hereafter. In fact, the active device showing in FIG. 2 is a PTFT structure.

Figure 3:
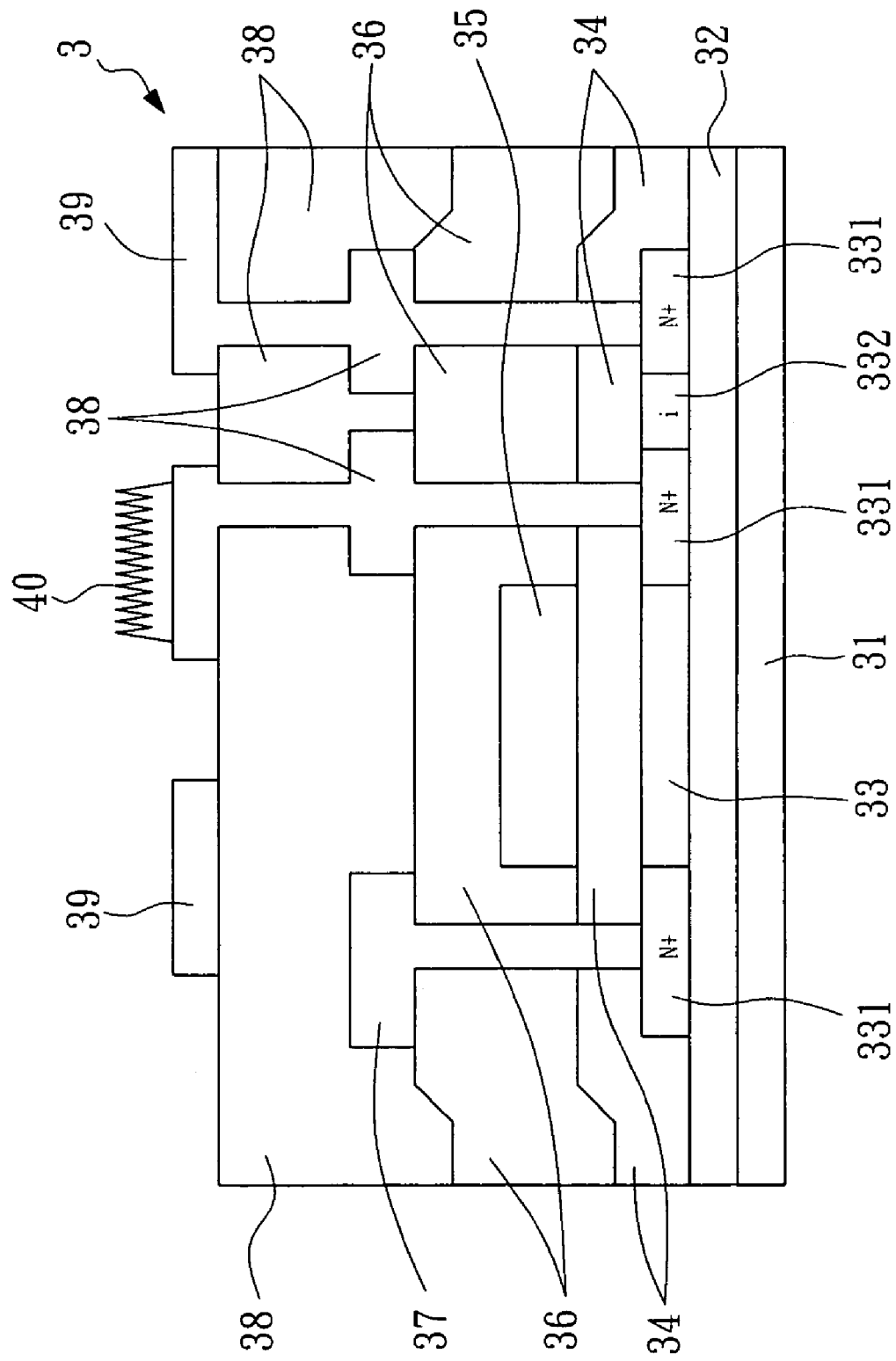
FIG. 3 is the schematic view showing the second embodiment of the active matrix triode field emission device according to the present invention.

Please refer to FIG. 3, which is the schematic view showing the second embodiment of the active matrix triode field emission device according to the present invention. The field emission device 3 comprises a glass substrate 31, an oxide layer 32, a silicon active layer 33, a gate oxide layer 34, a first metal layer 35, an ILD layer 36, a second metal layer 37, a passivation layer 38, a gate 39, and a tip structure 40. The present embodiment discloses an NTFT structure, of which the protective structure is an IN diode. The most difference between the structures of FIG. 3 and FIG. 2 is that the silicon active layer 33 includes the IN diode as the active device (driving circuit) consisting of a N$^+$-type doped region 331 and an intrinsic doped region 332, and other components are similar to those of the aforesaid PTFT structure thus not to be redundantly described anymore.

Figure 4:
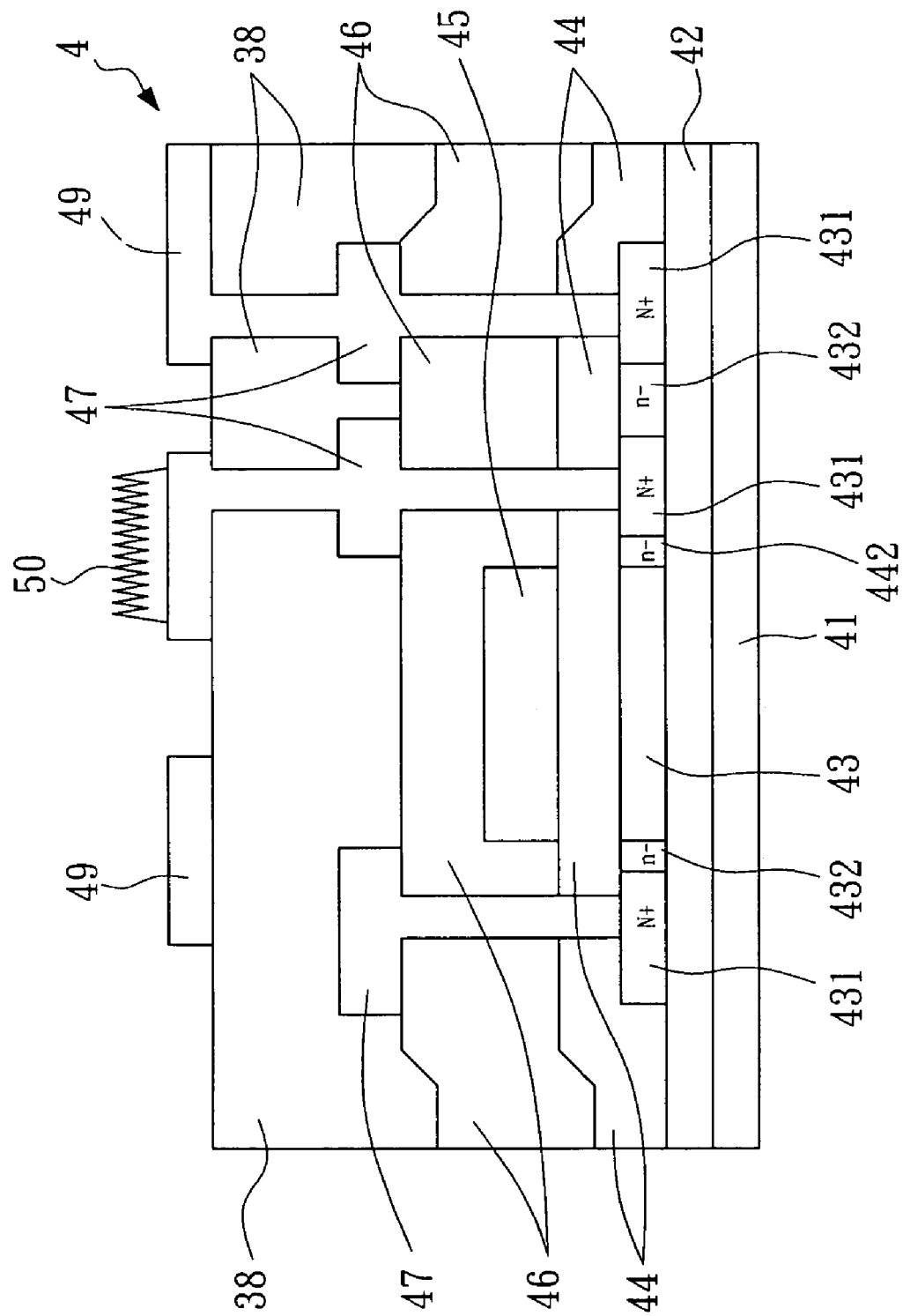
FIG. 4 is the schematic view showing the third embodiment of the active matrix triode field emission device according to the present invention.

Please refer to FIG. 4, which is the schematic view showing the third embodiment of the active matrix triode field emission device according to the present invention. The field emission device 4 comprises a glass substrate 41, an oxide layer 42, a silicon active layer 43, a gate oxide layer 44, a first metal layer 45, an ILD layer 46, a second metal layer 47, a passivation layer 48, a gate 49, and a tip structure 50. The present embodiment discloses a structure of which the active device (driving circuit) is NTFT and the silicon active layer 43 includes a Light-Doped Drain (LDD). Wherein, when the LDD and the source/drain are formed respectively, the interface of the diode will be simultaneously formed as N$^-$/N$^+$ (includes a N$^+$-type doped region 431, a N$^-$-type doped region 432), which has the advantage of raising break down voltage. Besides, the LDD forming process originally needs a mask for N$^+$ doping so that the protective structure will not use the extra mask process but has the better character than aforesaid PTFT and NTFT structure.

The structures disclosed in FIG. 2 to FIG. 4 have the same features that a PI or IN diode formed between the gate and tip structure of the field emission device. Wherein, the gate connects to the N-type region of the IN diode or the intrinsic region of the PI diode, and the tip structure connects to the intrinsic region of the IN diode or the P-type region of the PI diode. In the normal operating state, PI or IN diode is in forward bias so that the path from the gate to the tip structure will not be turned on. But if the electrostatic charges are accumulated to over the break down voltage of PI or IN diode thus causing the diode break down to turn on, the accumulated charges on the gate will be released to the tip structure through the diode until the reverse bias of the diode reducing to smaller than the break down voltage. Wherein, the tip structure is made of the materials that can emit electrons, such as nano carbon tubes. The electrostatic charges of the aforesaid structure will be released after accumulated to a certain amount so that the gate will not accumulate too many charges, causing electrostatic discharge, so the field emission device can be protected effectively. Moreover, in the normal operating state of the filed emission display possessing such protective structure, the voltage difference between the gate and the trips structure will not be larger than the break down voltage of the PN or IN diode and thus will not turn on the discharge path so that such protective structure will not affect the normal operating of the filed emission device.

Figure 5:
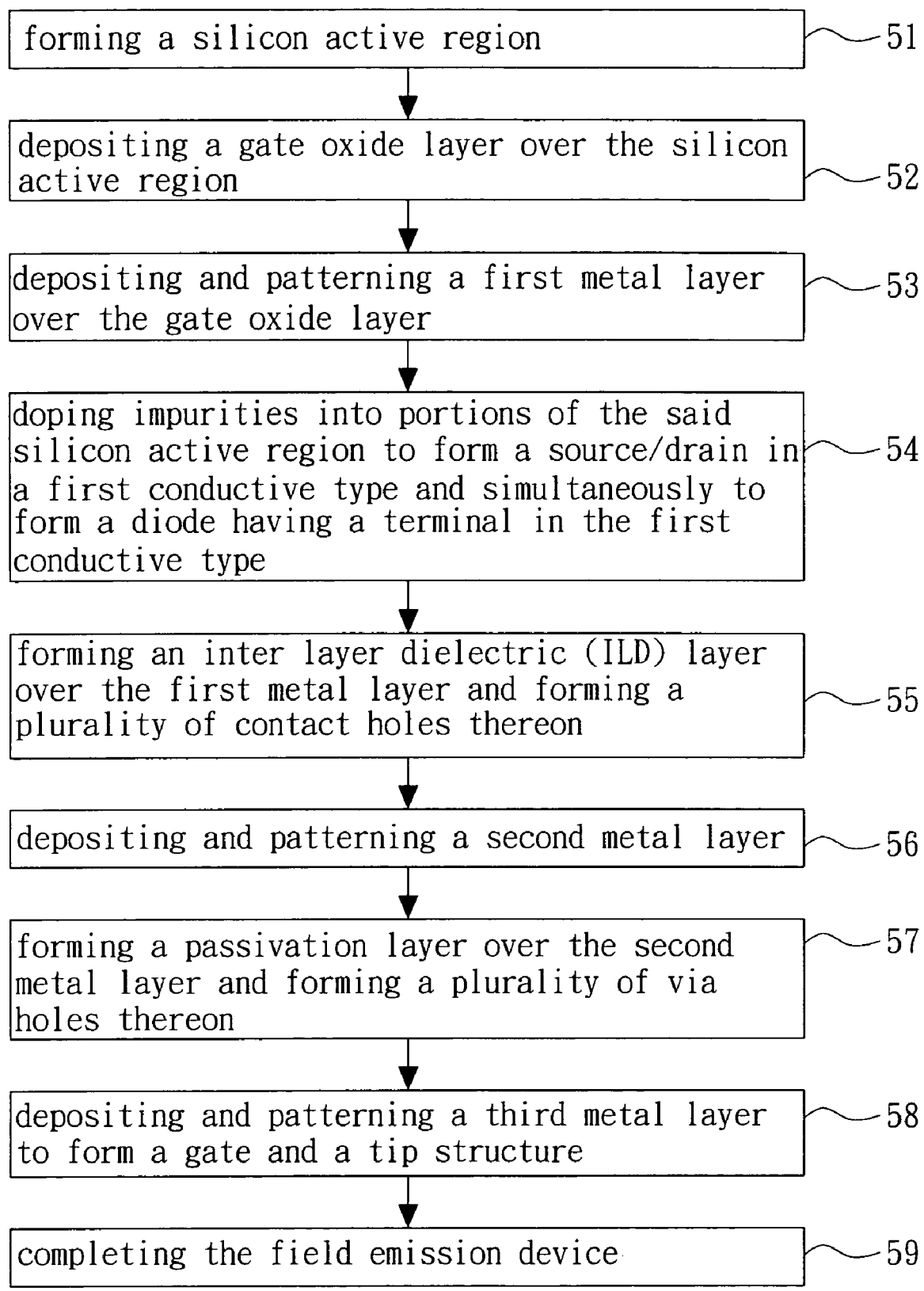
FIG. 5 is the manufacturing process flow of the active matrix triode filed emission device according to the present invention.

Please refer to FIG. 5, which is the manufacturing process flow of the active matrix triode filed emission device according to the present invention, comprising the steps of:

(51) forming a silicon active region

(52) depositing a gate oxide layer over the silicon active region

(53) depositing and patterning a first metal layer over the gate oxide layer

(54) doping impurities into portions of the said silicon active region to form a source/drain in a first conductive type and simultaneously to form a diode having a terminal in the first conductive type

(55) forming an inter layer dielectric (ILD) layer over the first metal layer and forming a plurality of contact holes thereon

(56) depositing and patterning a second metal layer

(57) forming a passivation layer over the second metal layer and forming a plurality of via holes thereon

(58) depositing and patterning a third metal layer to form a gate and a tip structure, wherein the gate connects to one terminal of the diode and the tip structure connects to the source/drain through the contact holes and said via holes

(59) completing the field emission device

Wherein, the tip structure is made of the materials that can emit electrons, such as nano carbon tubes. Moreover, in the step (54) if the active device (driving circuit) is PTFT, the protective structure will be a PI diode, of which the break down voltage is larger than the normal PN diode because the internal electric field of the PI or IN diode is smaller than the normal PN diode in the stable state. In the normal operating state, the voltage difference between the gate and the tip structure of the field emission device is not large enough to turn on the discharge path thus being not able to affect the normal function of the device.

As mentioned above, the present invention uses the same doping steps of the source/drain of an active matrix TFT, used for the component of cathode plate, to form a PI or IN diode as a protective structure so as to simplify the manufacturing process and reduce the manufacturing cost.

In summary, it will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method for manufacturing a protective structure of active matrix triode filed emission device, comprising the steps of:

forming a silicon active region;

depositing a gate oxide layer over said silicon active region;

depositing and patterning a first metal layer over said gate oxide layer;

doping impurities into portions of said silicon active region to form a source/drain in a first conductive type and simultaneously to form a diode having a terminal in said first conductive type;

forming an inter layer dielectric (ILD) layer over said first metal layer and forming a plurality of contact holes thereon;

depositing and patterning a second metal layer;

forming a passivation layer over said second metal layer and forming a plurality of via holes thereon; and depositing and patterning a third metal layer to form a gate and a tip structure while connecting said gate to one terminal of said diode and connecting said tip structure said source/drain through said contact holes and said via holes.

2. The method recited in claim 1, wherein said diode is a PI diode consisting of an intrinsic terminal connecting to said gate and a P-type terminal being said source/drain.

3. The method recited in claim 1, wherein said diode is an IN diode consisting of a N-type terminal connecting to said gate and an intrinsic terminal.

4. The method recited in claim 1, wherein said diode is an $N^-N^+$ diode consisting of a $N^+$ terminal connecting to said gate and a $N^{31}$ terminal.

5. The method recited in claim 1, wherein the tip structure is made of nano carbon tubes.

* * * * *